United States Patent
Gonzalez

(10) Patent No.: US 6,828,614 B2
(45) Date of Patent: Dec. 7, 2004

(54) SEMICONDUCTOR CONSTRUCTIONS, AND METHODS OF FORMING SEMICONDUCTOR CONSTRUCTIONS

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 10/388,721

(22) Filed: Mar. 13, 2003

(65) Prior Publication Data

US 2003/0219951 A1 Nov. 27, 2003

Related U.S. Application Data

(62) Division of application No. 10/133,168, filed on Apr. 26, 2002, now Pat. No. 6,599,817.

(51) Int. Cl.[7] ............... H01L 29/72; H01L 27/108; H01L 29/04
(52) U.S. Cl. ............... 257/300; 257/64; 257/486; 257/588; 257/754; 257/773
(58) Field of Search ............... 257/64, 477, 486, 257/506, 754, 755, 773, 588, 300, 587

(56) References Cited

U.S. PATENT DOCUMENTS

| | | | |
|---|---|---|---|
| 4,168,444 A | 9/1979 | Van Santen | |
| 4,866,498 A | 9/1989 | Myers | |
| 4,892,840 A | 1/1990 | Esquivel et al. | |
| 4,961,102 A | 10/1990 | Shideler et al. | |
| 5,391,912 A | * 2/1995 | Horiuchi et al. | 257/588 |
| 5,683,941 A | 11/1997 | Kao et al. | |
| 5,773,356 A | 6/1998 | Gonzalez et al. | |
| 5,849,622 A | 12/1998 | Hause et al. | |
| 5,949,092 A | 9/1999 | Kadosh et al. | |
| 6,037,639 A | 3/2000 | Ahmad | |
| 6,064,098 A | 5/2000 | Honeycutt et al. | |
| 6,087,214 A | 7/2000 | Cunningham | |
| 6,339,011 B1 | 1/2002 | Gonzalez et al. | |
| 6,368,940 B1 | * 4/2002 | Amon et al. | 438/424 |
| 6,410,409 B1 | 6/2002 | Gardner et al. | |
| 6,528,426 B1 | 3/2003 | Olsen et al. | |
| 6,653,677 B2 | * 11/2003 | Gonzalez | 257/300 |

* cited by examiner

Primary Examiner—Michael Lebentritt
(74) Attorney, Agent, or Firm—Wells St. John P.S.

(57) ABSTRACT

The invention includes an array of devices and a charge pump supported by a semiconductive material substrate. A damage region is under the array, and extends less than or equal to 50% of a distance between the array and the charge pump. The invention also includes a method in which a mask is formed over a monocrystalline silicon substrate. A neutral-conductivity-type dopant is implanted through an opening in the mask and into a section of the substrate to produce a damage region. A first boundary extends around the damage region. The masking layer is removed, and epitaxial silicon is formed over the substrate. An array of devices is formed to be supported by the epitaxial silicon. The array is bounded by a second boundary. The first boundary extends less than or equal to 100 microns beyond the second boundary.

25 Claims, 8 Drawing Sheets

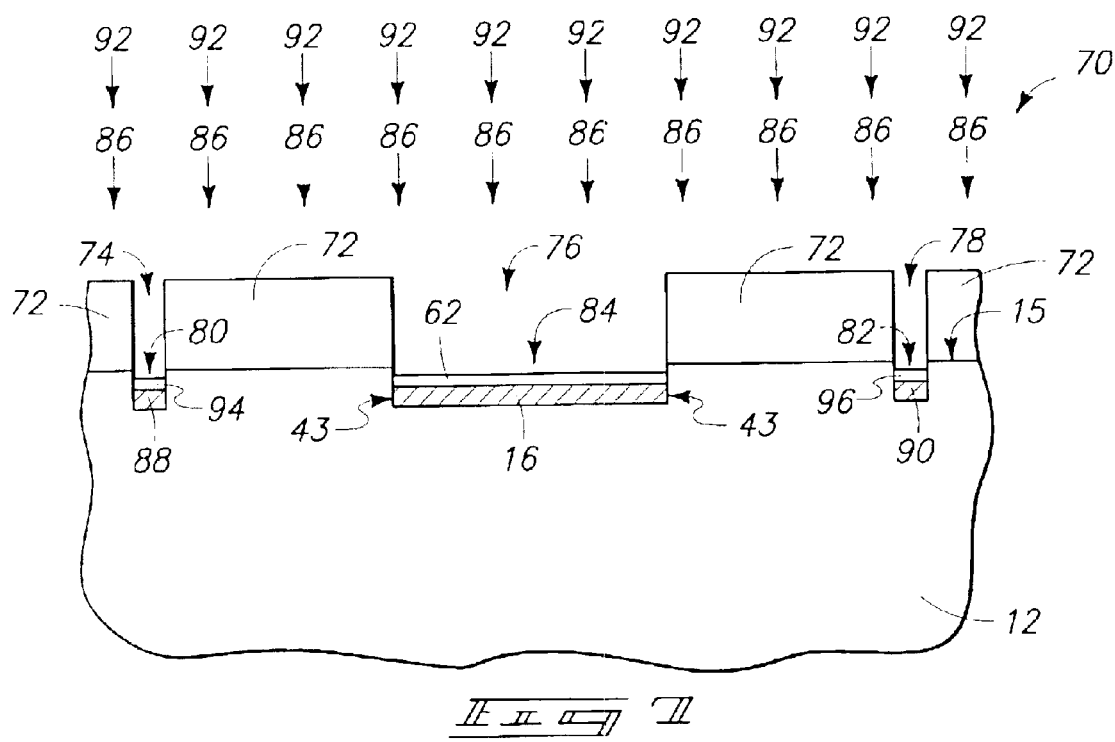
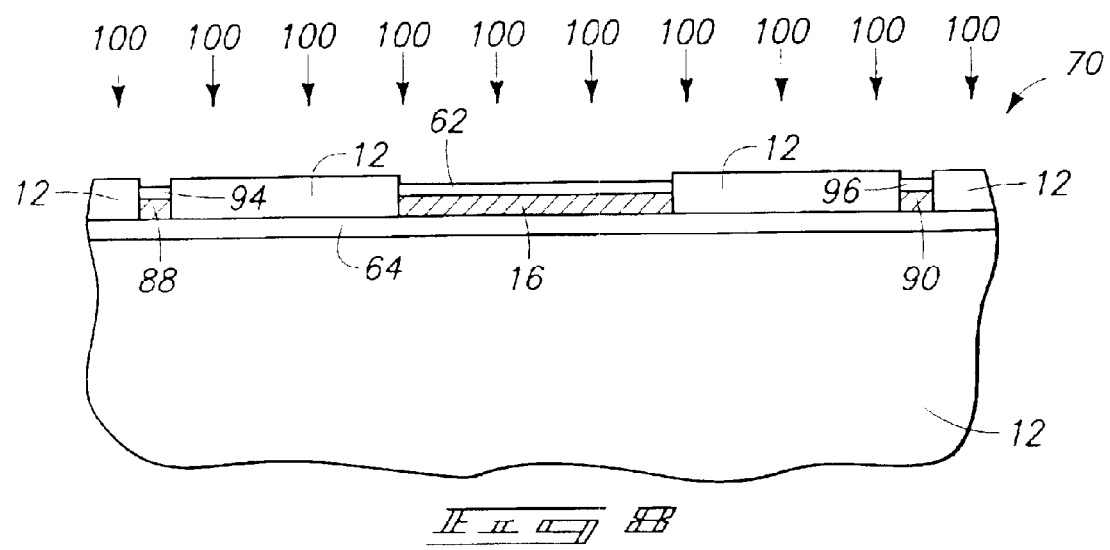

SEMICONDUCTOR CONSTRUCTIONS, AND METHODS OF FORMING SEMICONDUCTOR CONSTRUCTIONS

This patent resulted from a divisional application of U.S. patent application Ser. No. 10/133,168, which was filed Apr. 26, 2002 U.S. Pat. No. 6,599,817.

TECHNICAL FIELD

The invention pertains to semiconductor constructions comprising damage (or gettering) regions; and also pertains to methods of forming semiconductor constructions comprising damage (or gettering) regions.

BACKGROUND OF THE INVENTION

Impurity contamination of active area semiconductive materials is a problem within the semiconductor industry. Of particular concern are metallic contaminants, such iron, nickel and copper. When such impurities are present in semiconductive material of a device, the impurities can degrade the characteristics and reliability of the device. As integration in semiconductor devices becomes increasingly dense, the tolerance for metallic contaminants becomes increasingly stringent.

Among the methods for decreasing metallic contamination in semiconductor wafers are methods for improving cleanliness in semiconductor device manufacturing plants. However, regardless of how many steps are taken to insure clean production of semiconductor devices, some degree of contamination by metals seems inevitable. Accordingly, it is desirable to develop methods and structures for isolating metallic contaminants present in semiconductor wafers from devices which are ultimately formed within and upon such wafers. The act of isolating these contaminants is generally referred to as gettering, as the contaminants are gathered (typically physically and/or chemically), or gettered, to specific areas (referred to as "proximity gettering regions") within a semiconductor wafer.

Conventional processes for gettering metallic contaminants often focus on creating defects or damage within a semiconductor wafer in a region where gettering is sought to occur. Example embodiments of prior art methods for forming gettering regions are shown and described in U.S. Pat. No's. 6,339,011 and 5,773,356, both of which are hereby incorporated by reference.

The methods described in U.S. Pat. Nos. 5,773,356 and 6,339,011 form damage regions within bulk semiconductive materials, with an exemplary bulk material being a bulk monocrystalline silicon wafer. The monocrystalline silicon wafer can be lightly background doped with p-type and/or n-type material. The wafer can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A damage region can be formed within a semiconductive material substrate by implanting a neutral conductivity type dopant into the semiconductive material of the substrate. Exemplary neutral conductivity type dopants are $H_2$, He, Ge, Ar, Si, O, C and N. The implanting of the dopants can be conducted at an energy of less than 1.0 MeV and at a current density of from 0.5 A/cm$^2$ to 3.5 A/cm$^2$. The damage formed within the One or more conductivity-enhancing dopants can be implanted around the damage region during incorporation of the damage region into a proximity gettering region. For instance, one or both of phosphorous and boron can be implanted into an area surrounding the damage region.

FIGS. 1 and 2 illustrate a cross-sectional view and top view, respectively, of a prior art proximity gettering region formed within a semiconductive material wafer. More specifically, FIGS. 1 and 2 illustrate a construction 10 comprising a semiconductive material substrate 12. The semiconductive material substrate 12 can be, for example, monocrystalline silicon lightly-doped with a background p-type dopant.

A proximity gettering region 14 is formed within substrate 12. Gettering region 14 comprises a damage region 16 and a conductively-doped region 18 surrounding region 16. Damage region 16 can be formed by, for example, implanting a neutral-type dopant into substrate 12. The implant disrupts a lattice of the semiconductive material to form extended crystal lattice defects within the semiconductive material. The defects can comprise, consist essentially of, or consist of vacancies in the crystalline lattice, and the term "extended" indicates that the defects are larger than point defects. It is desirable that the implant utilized to form the damage region is at a low enough dose and duration that the crystalline semiconductive material is not appreciably converted to an amorphous form by the implant, and yet is at a high enough dose and duration to form the desired extended lattice defects. It is also desired that the defects be stable to a thermal budget less than or equal to that utilized in convention CMOS processing.

Doped region 18 can be formed by implanting a conductivity enhancing dopant into material 12 at a suitable depth to surround the damage region. The conductivity enhancing dopant of region 18 can be an opposite-type to that utilized in the background doping of material 12. Accordingly, if material 12 is background-doped with a p-type dopant, region 18 can be doped with an n-type dopant (such as, for example, phosphorous). Alternatively, if substrate 12 is background-doped with an n-type dopant, region 18 can be doped with a p-type dopant (such as, for example, boron).

Substrate 12 comprises an upper surface 15, and gettering region 14 is typically formed at a depth "D" of greater than 4 microns beneath upper surface 15. Gettering region 14 can be formed at such depth by implanting dopants through upper surface 15 and into the material 12 to a desired depth. Alternatively, a substrate can initially be provided to have an upper surface approximately coextensive with the location where gettering region 14 is ultimately to be formed. Gettering region 14 can then be formed by a shallow implant into the substrate to form the gettering region along the upper surface of the substrate. Subsequently, additional monocrystalline material can be epitaxially formed over the gettering region 14 to provide the material between gettering region 14 and upper surface 15.

Ultimately, various devices are formed to be supported by substrate 12. The devices can be formed over the substrate, and further can comprise portions within the substrate. For instance, the devices can include transistor devices having gates formed over the substrate and source/drain regions formed within the substrate. Various devices are illustrated diagrammatically in FIGS. 1 and 2 by blocks 20 and 22.

Block 20 can correspond to a plurality of devices which are to be protected from metallic contaminants by gettering region 14. Such devices can include, for example, memory devices, and such would typically be arranged in an array. Exemplary memory devices are dynamic random access memory (DRAM) devices. As another example, the devices 20 can correspond to FLASH devices, such as, for example, erasable programmable read only memory (EPROM) and electrically erasable programmable read only memory (EEPROM) devices.

As block 20 is a simplified schematic representation of devices, it can accordingly be referred to herein as devices 20. Further, in various applications block 20 can be considered a simplified schematic of an array of devices (such as memory devices), and in such applications block 20 can be considered an array 20.

Block 22 can be, in particular aspects, considered a simplified schematic representation of devices associated with a charge pump, and accordingly block 22 can be referred to herein as a charge pump 22. The charge pump generates electrons which are directed into substrate 12 to maintain a desired potential within the substrate. The electrons are illustrated diagrammatically by wavy lines 24 and 26 within FIG. 1.

A problem which can occur in utilizing gettering region 14 in combination with a charge pump is that some of the electrons generated by charge pump 22 can be deflected by either doped region 18 or damage region 16, and directed toward devices 20 (as illustrated by the path of electron 26). It is desired that the electrons instead follow the path of electron 24, whereby the electrons penetrate into material 12, and do not interfere with the operation of devices 20.

A method for avoiding the deflection of an electron 26 toward devices 20 is to separate the charge pump 22 from the devices by a large enough gap so that electrons from pump 22 don't reach devices 20. Typically, the diffusion length of an electron in monocrystalline silicon (i.e., the distance that an electron can travel through monocrystalline silicon before it recombines with other materials and is effectively neutralized) is about 500 microns, on average. The average diffusion length for electrons can vary depending on the material that the electrons are diffusing through.

If material 12 is a substance in which an average diffusion length of an electron is 500 microns or less, then spacing of pump 22 from devices 20 by at least about 500 microns can alleviate, and possibly even prevent, problems associated with deflected electrons. However, such large separation between a charge pump and the devices consumes a substantial amount of semiconductor substrate real estate in the gap between the charge pump and the semiconductor devices. Semiconductor real estate becomes increasingly valuable as efforts are made to increase the density of devices across a semiconductor substrate. Accordingly, it would be desirable to develop alternative methods for removing the problem associated with deflected electrons 26.

Another method which has been utilized to avoid the problem with deflected electrons 26 is to bury gettering region 14 relatively deep beneath surface 15 of material 12. If gettering region 14 is at least 7 microns beneath surface 15, such increases a distance that deflected electrons need to travel to device 20 relative to shallower gettering regions, and such can alleviate, and even prevent, problems associated with deflected electrons 26. However, if the gettering region is too deep beneath devices 20, the gettering region does not function as well to protect the devices from metallic contaminants as would a shallower gettering region. Accordingly, it is desirable to develop alternative methods for avoiding the problems associated with deflected electrons 26 than simply increasing a depth of gettering region 14.

SUMMARY OF THE INVENTION

In one aspect, the invention encompasses a construction comprising an array of devices supported by a substrate comprising a semiconductive material. The array is bounded by an outer periphery. A damage region is within the semiconductive material of the substrate and under the array of devices. The damage region extends beyond the outer periphery of the array of devices by less than or equal to about one-half of an average electron diffusion length within the semiconductive material.

In one aspect, the invention encompasses a semiconductor construction comprising an array of devices and a charge pump supported by a semiconductive material substrate. A damage region is within the semiconductive material of the substrate and under the array of memory devices. The charge pump is separated from the array of memory devices by a distance, and the damage region extends less than or equal to 50% of the distance between the memory devices and the charge pump.

In one aspect, the invention encompasses a method of forming a semiconductor construction. A monocrystalline silicon substrate is provided, and a patterned masking layer is formed over the substrate. The patterned masking layer has first openings extending therethrough to expose regions of the substrate where alignment markings are to be formed. The first openings are extended into the exposed regions of the substrate to form the alignment markings. A second opening is formed into the masking layer over a section of the substrate which will ultimately be beneath an array of memory devices. A neutral-conductivity-type dopant is implanted through the second opening and into the section of the substrate to produce a damage region within the section. A first boundary extends laterally around the damage region. The masking layer is removed, and subsequently a layer of epitaxial silicon is formed over the monocrystalline silicon substrate. An array of memory devices is formed to be supported by the layer of epitaxial silicon. The array is bounded by a second boundary extending laterally around the array. The first boundary extends less than or equal to 100 microns beyond the second boundary.

BRIEF DESCRIPTION OF THE DRAWINGS

Preferred embodiments of the invention are described below with reference to the following accompanying drawings.

FIG. 7 is a view of the FIG. 5 construction shown at a processing stage subsequent to that of FIG. 6.

FIG. 8 is a view of the FIG. 5 construction shown at a processing stage subsequent to that of FIG. 7.

DETAILED DESCRIPTION OF THE PREFERRED EMBODIMENTS

Figure 1:
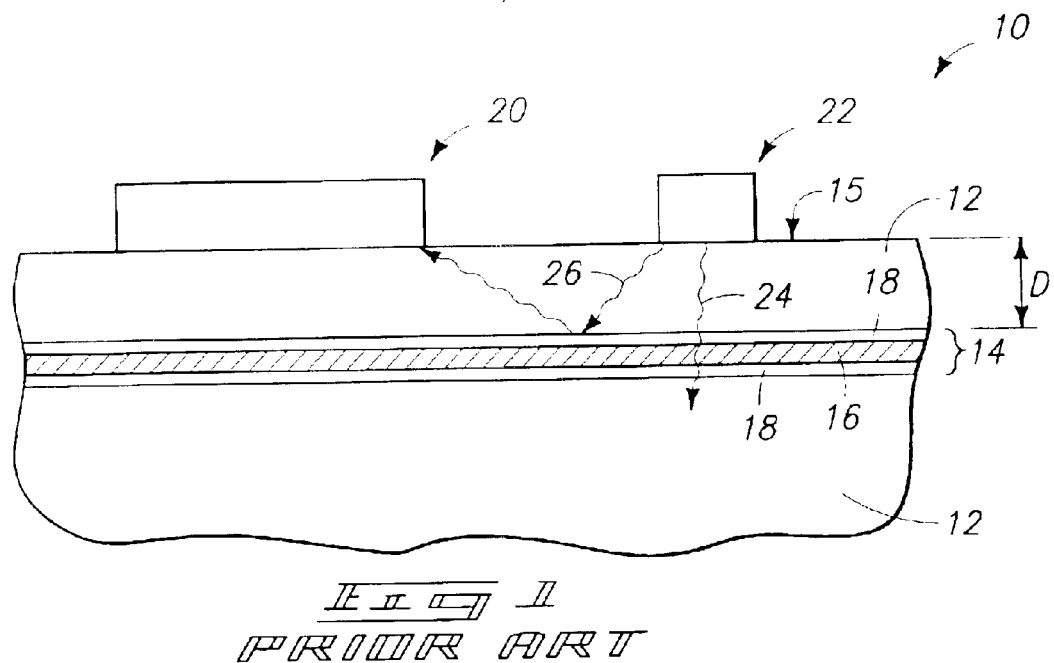
FIG. 1 is a diagrammatic, cross-sectional view of a prior art semiconductor construction comprising a proximity gettering region, a charge pump, and devices spaced from the charge pump by a gap.
Figure 2:
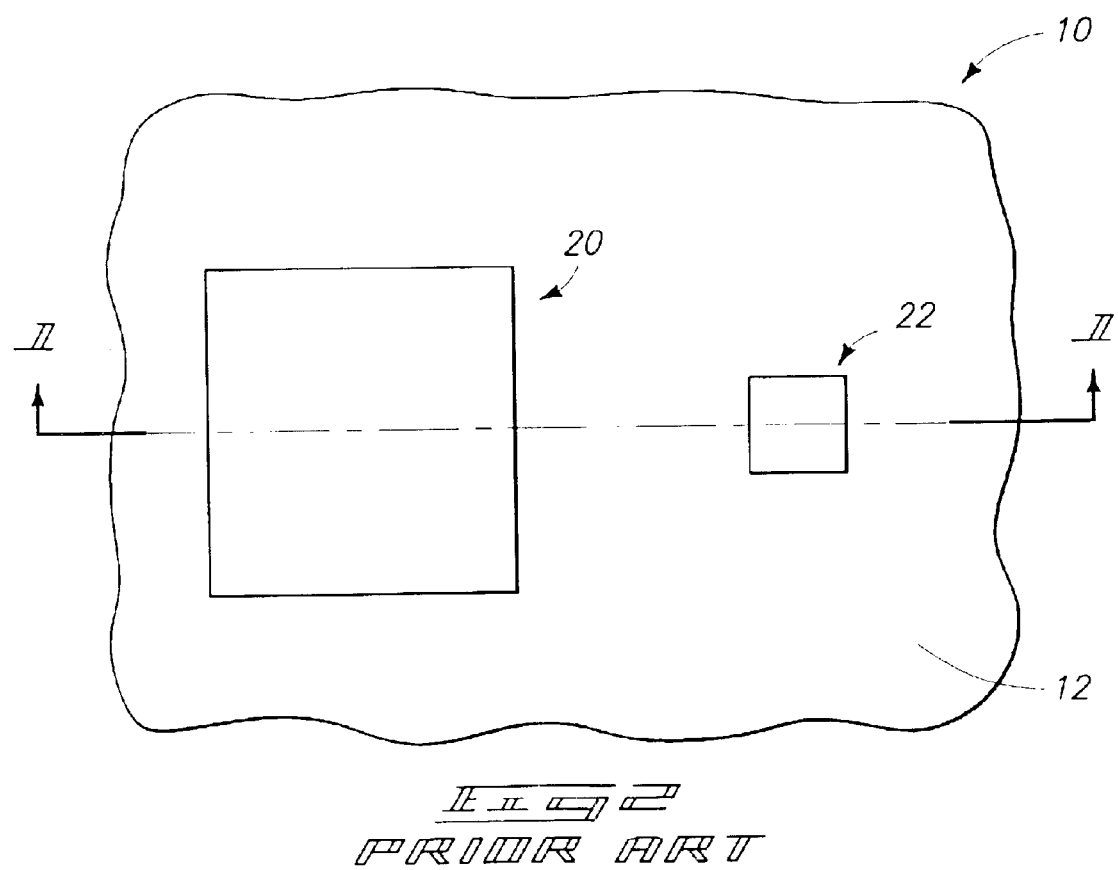
FIG. 2 is a top view of the FIG. 1 construction.
Figure 3:
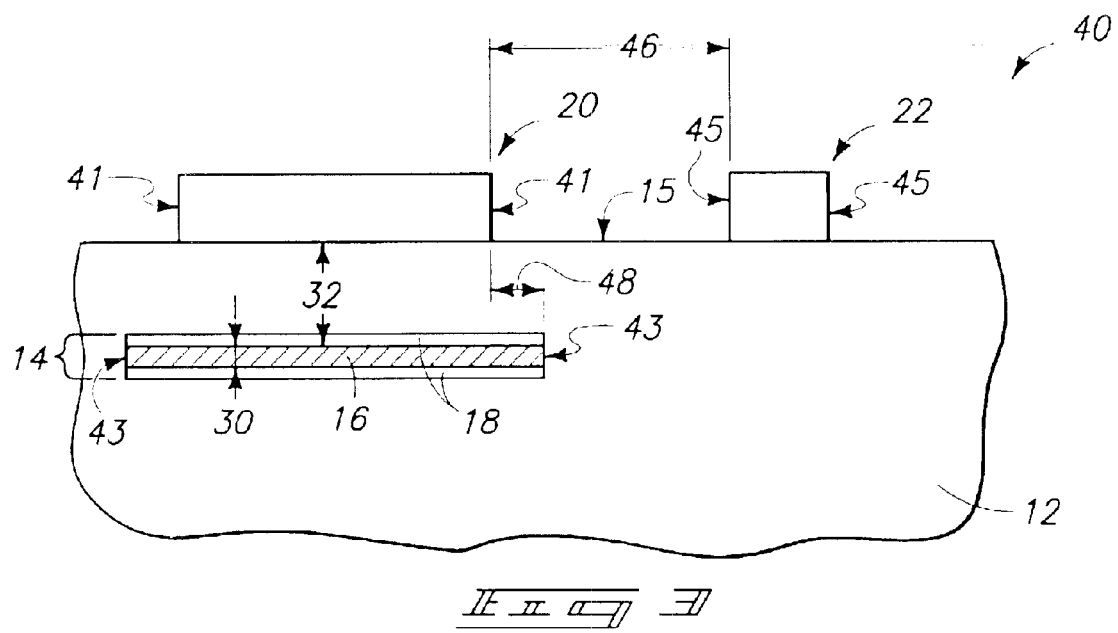
FIG. 3 is a diagrammatic, cross-sectional view of a semiconductor construction formed in accordance with an exemplary aspect of the present invention.

An exemplary construction formed in accordance with an aspect of the present invention is shown in FIG. 3. In referring to the construction of FIG. 3, similar numbering will be used as was utilized in describing the prior art construction of FIGS. 1 and 2, where appropriate.

The construction of FIG. 3 is referred to generally with the label 40. Such construction includes a substrate 12, devices 20, and a charge pump 22. Devices 20 are protected by proximity gettering region 14 formed under the devices.

Devices 20 can correspond to, for example, a memory array, such as, for example, a DRAM array. As another example, the devices can correspond to FLASH memory devices. As yet another example, the devices can be associated with a solar cell. Devices 20 are bounded by an outer lateral periphery 41.

Gettering region 14 comprises a damage region 16, and a doped region 18 extending above and below damage region 16. Damage region 16 has an elevational spread 30 (typically referred to as "$R_p$"). The elevational spread will typically be increased when higher implant energies and current densities are utilized to form damage region 16 relative to when lower implant energies and current densities are utilized to form the region. Also, the elevational spread will typically be increased if region 16 is subjected to thermal processing after formation of the region. A distance between an uppermost portion of damage region 16 and a surface 15 of substrate 12 is identified in the figure with the label 32. Such distance is less than or equal to 4 microns in preferred aspects of the invention. Gettering region 14 is under devices 20.

Damage region 16 comprises an outer lateral periphery 43. In the shown application, the outer lateral periphery 43 of damage region 16 is coextensive with an outer lateral periphery across doped regions 18. It is to be understood, however, that the doped regions can have a different lateral periphery than the damage region.

Charge pump 22 has an outer lateral periphery 45 associated therewith. Charge pump 22 is separated from the devices 20 by a distance 46, which corresponds to the closest distance between the outer lateral periphery 41 associated with devices 20 and the outer lateral periphery 45 associated with charge pump 22. Distance 46 is typically about 400 microns.

It is desired that damage region 16 does not extend under charge pump 22, and further that damage region 16 be laterally displaced from charge pump 22 by enough distance that deflection of even sideways-directed electrons from pump 22 (such as, for example, the electron 26 of FIG. 1) does not occur. Accordingly, it is desired that outer periphery 43 associated with damage region 16 extend less than or equal to 50% of the distance 46 between devices 20 and charge pump 22. In particular applications, it can be desired that periphery 43 extend less than or equal to 25% of the distance 46, less than or equal to 10% of such distance, less than or equal to 5% of such distance, or less than or equal to 1% of such distance. Alternatively considered, in applications in which distance 46 is about 400 microns, it can be desired that lateral periphery 43 extend less than or equal to about 100 microns outwardly beyond lateral periphery 41 of devices 20. It can be further desired that lateral periphery 43 extend less than or equal to 50 microns outwardly beyond periphery 41, less than or equal to about 10 microns beyond periphery 41, less than or equal to about 5 microns beyond outer periphery 41, and even less than or equal to about 1 micron beyond outer periphery 41. In yet other applications, it can be desired that the outer periphery 43 of damage region 16 does not extend at all outwardly beyond outer periphery 41 of devices 20. A distance by which periphery 43 extends outwardly (or laterally) beyond periphery 41 of devices 20 is illustrated in FIG. 3 as distance 48.

Figure 4:
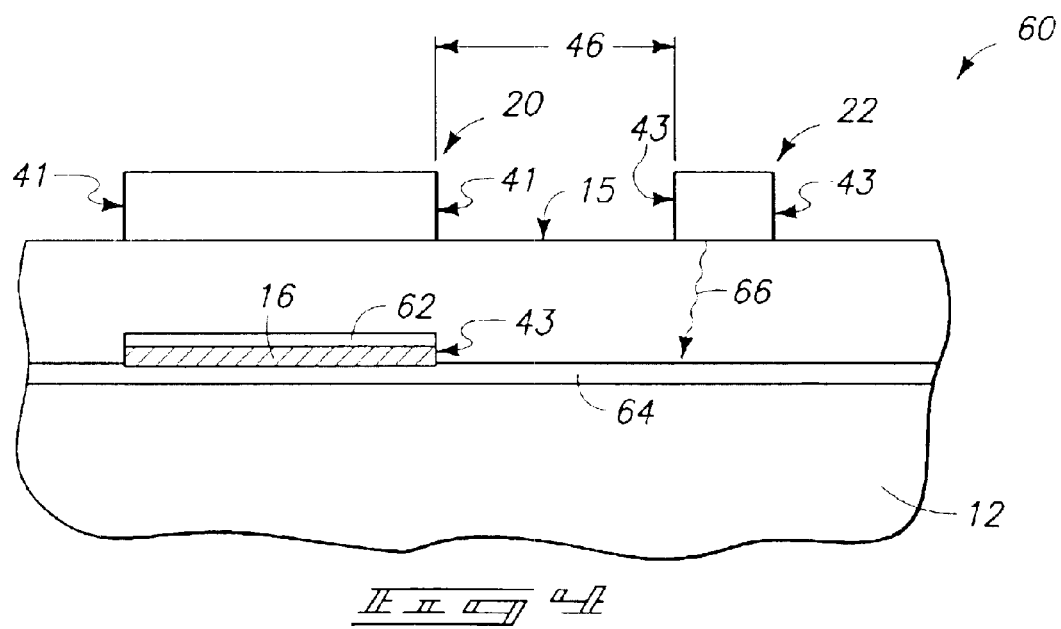
FIG. 4 is a diagrammatic, cross-sectional view of a semiconductor construction in accordance with another exemplary aspect of the invention.

FIG. 4 illustrates a construction 60 in accordance with an alternative aspect of the invention relative to that described above with reference to FIG. 3. In referring to construction 60, similar numbering will be used as was used above in referring to the construction 40 of FIG. 3, where appropriate. Construction 60 comprises substrate 12 having a damage region 16 therein. A first doped region 62 is above damage region 16, and a second doped region 64 is below damage region 16. Doped regions 62 and 64 can comprise identical dopants as were discussed above relative to regions 18 of FIG. 3. A difference between the doped regions 62 and 64 of FIG. 4 and the doped regions 18 of FIG. 3 is in the distance that doped regions 62 and 64 extend. Specifically, doped region 62 shares the lateral periphery 43 of damage region 16, but doped region 64 extends beyond the lateral periphery 43.

Construction 60 comprises the charge pump 22 and devices 20 discussed previously with reference to FIG. 3. Devices 20 are separated from charge pump 22 by the distance 46.

An electron 66 is shown being emitted from charge pump 22 into substrate 12. Although it is possible for electron 66 to be deflected off from doped region 64 and back toward devices 20 (analogously to the deflection of electron 26 described reference to FIG. 1), in preferred embodiments doped region 64 will be deep enough within material 12 that a deflected electron will be effectively neutralized before reaching devices 20. Since region 64 is deeper than either of regions 62 or 16, it is possible for region 64 to be deep enough that electrons deflected from region 64 will not reach devices 20, even though electrons deflected off of doped areas at the depths of regions 16 and 62 could reach the devices. Accordingly, the embodiment of FIG. 4 can be considered to truncate the lateral peripheries of doped region 62 and damage region 16 so that the regions do not extend to a location where electrons from charge pump 22 are likely to be deflected from the regions, but does not incorporate a similar truncation to the lateral periphery of the deep doped region 64. It can be preferred that doped region 64 have an uppermost level that is at least 7 microns deep within substrate 12 in applications in which distance 46 between charge pump 22 and devices 20 is at least 400 microns. Such can effectively preclude electrons deflected off from the region 64 subsequently reaching devices 20.

In particular applications, doped regions 62 and 64 can both be p-type doped regions, and material 12 can comprise monocrystalline silicon lightly-doped with n-type dopant. In other applications, regions 62 and 64 can both comprise n-type regions, and material 12 can comprise monocrystalline silicon lightly-doped with p-type dopant. In yet other applications, one of regions 62 and 64 can comprise a p-type region, and the other can comprise an n-type region, regardless of the background doping within semiconductive material 12. An exemplary method which can be utilized in various aspects of the invention is described with reference to FIGS. 5–9. In referring to FIGS. 5–9, similar numbering will be used as was utilized above in describing FIGS. 3 and 4, where appropriate.

Figure 5:
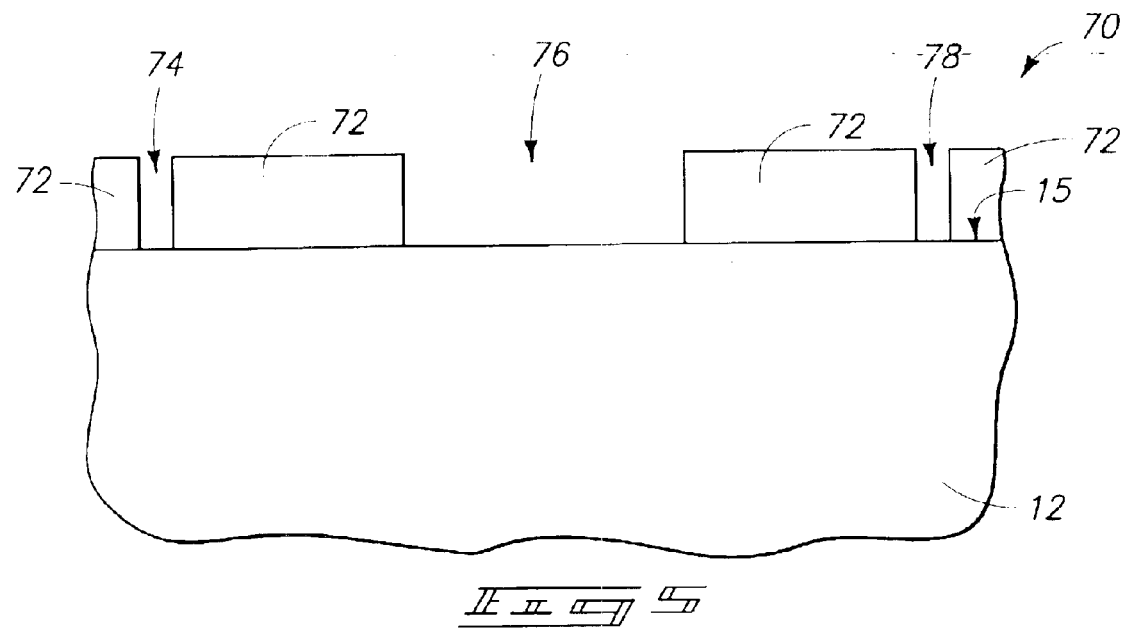
FIG. 5 is a diagrammatic, cross-sectional view of a semiconductor construction at a preliminary stage of an exemplary method of the present invention.

Referring initially to FIG. 5, a construction 70 is illustrated. Construction 70 includes a semiconductor material substrate 12 (which can be, for example, monocrystalline silicon lightly-doped with one or both of n-type and p-type dopant).

A patterned masking layer 72 is formed over material 12. Masking layer 72 can comprise, for example, photoresist, and can be patterned into the shown configuration utilizing photolithographic processing.

Several openings extend through patterned masking material 72 to the upper surface 15 of semiconductive material 12. The openings are labeled 74, 76 and 78. For purposes of the discussion that follows, openings 74 and 78 can be referred to as first openings, and opening 76 can be referred to as a second opening. Second opening 76 exposes a section of the substrate within which a damage region is ultimately formed. First openings 74 and 78 are ultimately utilized to form alignment markings within semiconductive material 12.

Formation of alignment markings within a semiconductive material is utilized in conventional processing of semiconductive material wafers so that sequential processing steps associated with a wafer can be aligned relative to one another. Accordingly, the formation of first openings 74 and 78, and the subsequent utilization of the first openings to form alignment markings, can be in accordance with conventional processing. Thus, an advantage of the processing of FIG. 5 is that the masking layer 72 would typically be provided in conventional process steps, and does not comprise a new masking layer utilized in applications of the present invention. Formation of second opening 76 in the processing of FIG. 5 can therefore be considered to comprise utilization of a masking material (72) associated with conventional processing to pattern an opening (76) desired in methodology of the present invention.

It is noted that the scale of FIG. 5 is not accurate. Specifically, openings 74 and 78 would typically be formed at edges of a semiconductor material wafer, and opening 76 would be formed somewhere in an interior region of the wafer. Accordingly, there would typically be a large distance between the first openings (74 and 78) and the second opening (76). Further, multiple second openings could be formed in the processing step represented by FIG. 5, even though only one second opening is illustrated.

Figure 6:
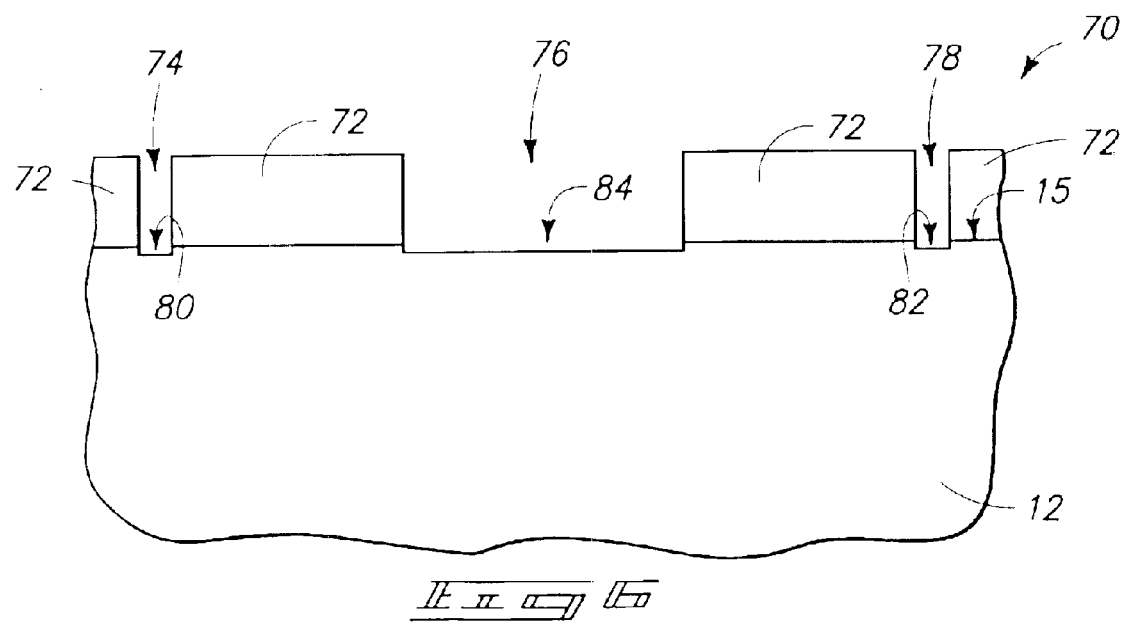
FIG. 6 is a view of the FIG. 5 construction shown at a processing stage subsequent to that of FIG. 5.

Referring to FIG. 6, openings 74, 76 and 78 are extended into semiconductive material 12. The extension of first openings 76 and 78 into material 12 forms alignment markings 80 and 82 within the material. The extension of second opening 76 into material 12 forms a cavity 84 within the material. Typically, alignment markings 80 and 82 are formed to be trenches which are about 1450 angstroms deep, and from about 5 microns to about 10 microns wide. The etching into material 12 can be accomplished utilizing, for example, one or more of $CF_4$, $O_2$, $SF_6$, $Cl_2$, and $CF_3Cl$.

Referring to FIG. 7, a neutral-conductivity-type dopant 86 is implanted through openings 74, 76 and 78 and into exposed sections of substrate 12 to form damage regions 88, 16 and 90 within the substrate. The damage region 16 has a lateral periphery 43 resulting from the implant of dopant through a window defined by opening 76. Periphery 43 can be considered a boundary extending around a lateral periphery of damage region 16, and can be referred to herein as a first boundary.

The neutral-conductivity-type dopant can include, for example, or more of $H_2$, helium, germanium, argon, silicon, oxygen, carbon and nitrogen. The dopant can be implanted utilizing an energy of about 0.7 MeV, a current density of about 1.5 A/cm$^2$, and a dose of about $1\times10^{14}$ atoms/cm$^2$. The resulting implant regions 88, 16 and 90 will have preferred $R_p$ of from about 30 angstroms to about 1500 angstroms, and preferred peak depth beneath upper surface 15 of about 600 angstroms.

Damage regions 88, 16 and 90 can result from the neutral-conductivity-type dopant disrupting a lattice of semiconductive material 12 to form extended lattice defects. For instance, if the semiconductive material 12 comprises monocrystalline silicon and the neutral-conductivity-type dopant comprises germanium, the germanium can disrupt a lattice of the silicon to form the damage regions. It is noted that in particular applications not all of the implanted neutral-conductivity-type dopant is within a damage region. Instead, some of the neutral-conductivity-type dopant can be above and/or below the damage region. Also, neutral-conductivity-type dopant from the damage region can be subsequently diffused to locations above and/or below the damage region. In particular aspects, some of the neutral-conductivity-type dopant can be subsequently diffused to active regions associated with devices formed over the damage region.

FIG. 7 illustrates a conductivity-enhancing dopant 92 being implanted through openings 74, 76 and 78 and into exposed regions of substrate 12 to form doped regions 94, 62 and 96 within the substrate. Dopant 92 can comprise either n-type or p-type connectivity enhancing dopant. Doped regions 94, 62 and 96 can comprise a dopant concentration of, for example, from about $1\times10^{14}$ atoms/cm$^3$ to about $5\times10^{15}$ atoms$^3$.

Although neutral-conductivity-type dopant 86 is described as being implanted before conductivity-enhancing dopant 92, it is to be understood that the order of the implants can be reversed.

Doped region 62 has a lateral periphery approximately coextensive with the periphery 43 of damage region 16. Doped region 62 is formed above damage region 16.

Referring to FIG. 8, masking material 72 (FIG. 7) is removed and subsequently a dopant 100 is implanted to form doped region 64. Dopant 100 can comprise, for example, either n-type or p-type conductivity-enhancing dopant, and doped region 64 can be formed to comprise a dopant concentration of from about $1 \times 10^{14}$ atoms/cm$^3$ to about $5 \times 10^{15}$ atoms/cm$^3$.

Figure 9:
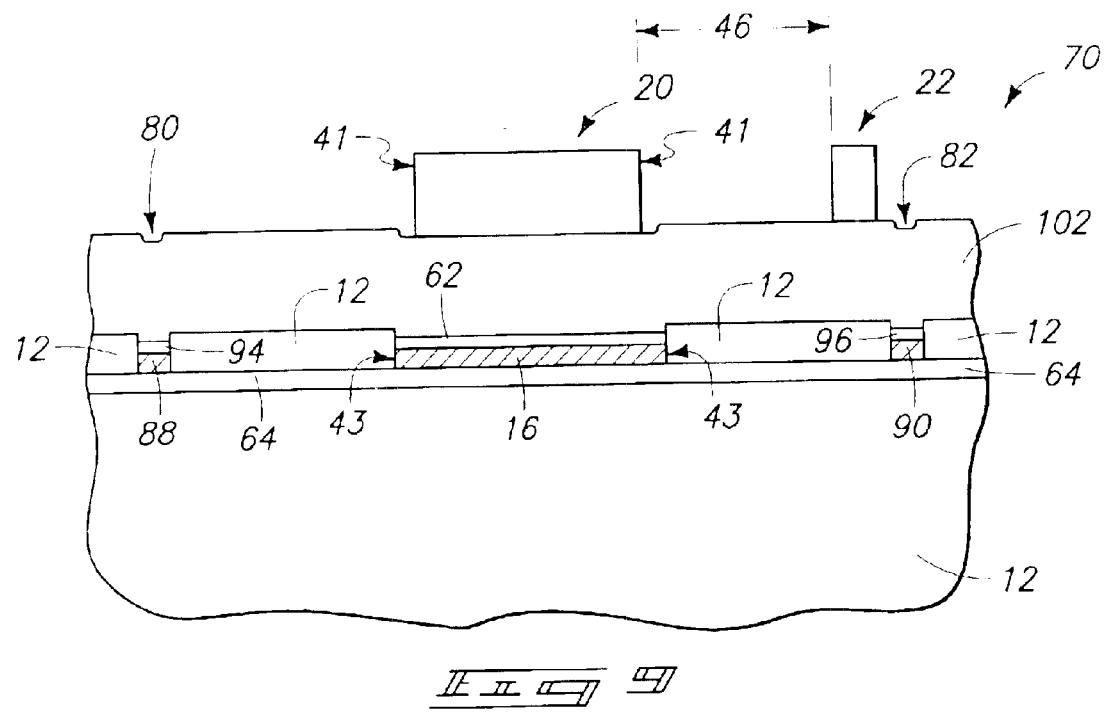
FIG. 9 is a view of the FIG. 5 construction shown at a processing stage subsequent to that of FIG. 8.

Referring to FIG. 9, a layer 102 of epitaxial semiconductor material is formed over substrate 12. If substrate 12 comprises monocrystalline silicon, then the material of layer 102 can comprise epitaxially formed monocrystalline silicon. The epitaxial material of layer 102 can be formed by deposition or growth (by any existing or yet-to-be developed technique), and is preferably formed to be less than or equal to about 4 microns thick.

Block 20 corresponding to memory or other devices is formed to be supported by layer 102, and charge pump 22 is also formed to be supported by layer 102. Again, it is to be understood that the diagrams of the present application are not drawn to scale.

The devices 20 comprise a lateral periphery 41 which can be considered to be a boundary around the devices. In particular applications, block 20 corresponds to an array of memory devices, and periphery 41 is a boundary around the array. Lateral periphery 41 can be referred to as a second boundary to distinguish it from the first boundary 43 associated with damage region 16. The devices 20 are separated from charge pump 22 by a distance 46 which, as discussed above with reference to FIGS. 3 and 4, is typically about 400 microns. The construction 70 of FIG. 9 is comparable to the construction 60 of FIG. 4, particularly when it is understood that layer 102 can comprise a monocrystalline material identical to that of substrate 12.

The formation of damage regions 88 and 90, and doped regions 94 and 96, within the alignment regions 80 and 82 of construction 70 is unusual relative to prior practices but can be inconsequential to further processing of the construction. Specifically, alignment regions 80 and 82 can function as traditional alignment regions, even though the damage regions and doped regions have been formed within the alignment regions. Also, it is noted that the formation of epitaxial layer 102 over alignment regions 80 and 82 does not hinder utilization of the alignment regions, but rather simply transfers the trenches associated with the alignment regions upwardly to a top surface of the layer 102. Alignment region trenches 80 and 82 can be formed to be wide enough so that the epitaxial fill of the trenches does not lose desired optical properties associated with the alignment regions. In other words, the alignment region trenches can be formed to have suitable dimensions to compensate for the epitaxial fill so that an upper surface of the epitaxial fill over the initially-formed alignment region trenches has suitable alignment marking optical properties.

Figure 10:
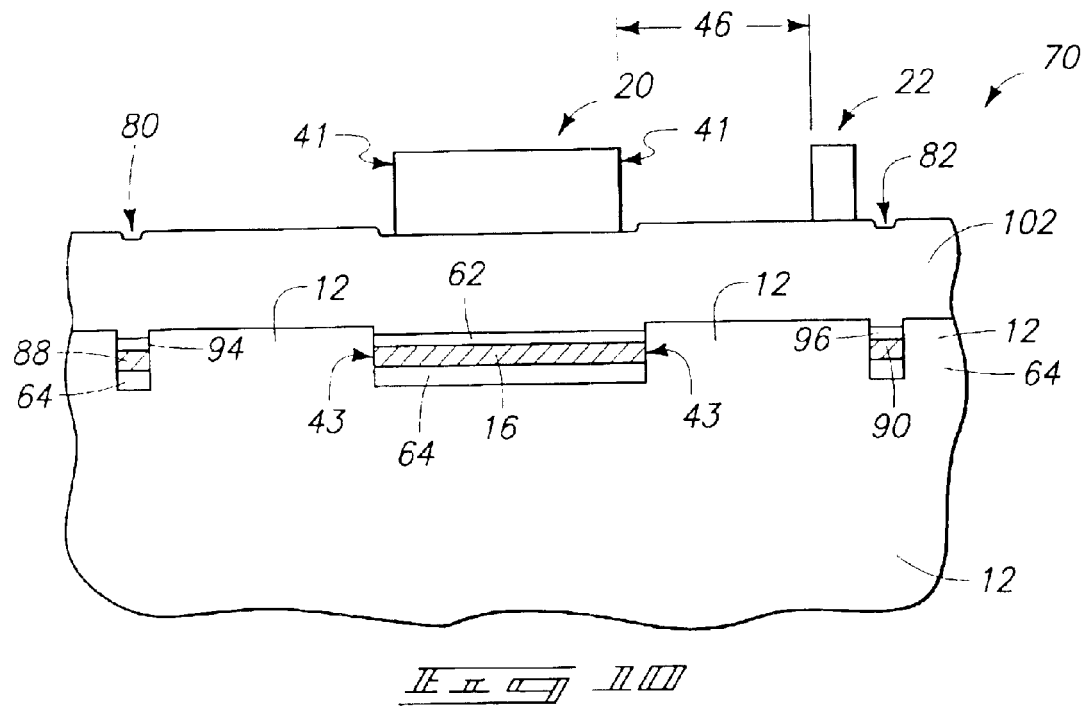
FIG. 10 is a view of the FIG. 5 construction shown at a processing stage subsequent to that of FIG. 7, in accordance with another exemplary aspect of the present invention.

Although the masking layer (72) is shown removed prior to the implant of dopant 100 in forming the doped region beneath damage region 16, it is to be understood that the masking region could also be left in place. FIG. 10 illustrates a construction 110 formed by providing the doped region beneath damage region 16 while masking layer 72 is in place. The doped region 64 has a lateral periphery approximately coextensive with the lateral periphery 43 of damage region 16, since the doped region 64 was formed utilizing the same opening (76 of FIG. 7) as that utilized to form implant region 16. The doped region 64 can ultimately extend to a different lateral periphery than doped region 16 if further processing is conducted which diffuses the dopants of regions 64 and 16 differently relative to one another. The construction of FIG. 10 is analogous to that of FIG. 3, and in applications in which doped regions 62 and 64 comprise an identical dopant to one another, the regions can be considered to correspond to the regions 18 of FIG. 3. Further, if doped regions 62 and 64 comprise identical doping as one another, the regions can be formed simultaneously with a single implant have a wide $R_p$.

Figure 11:
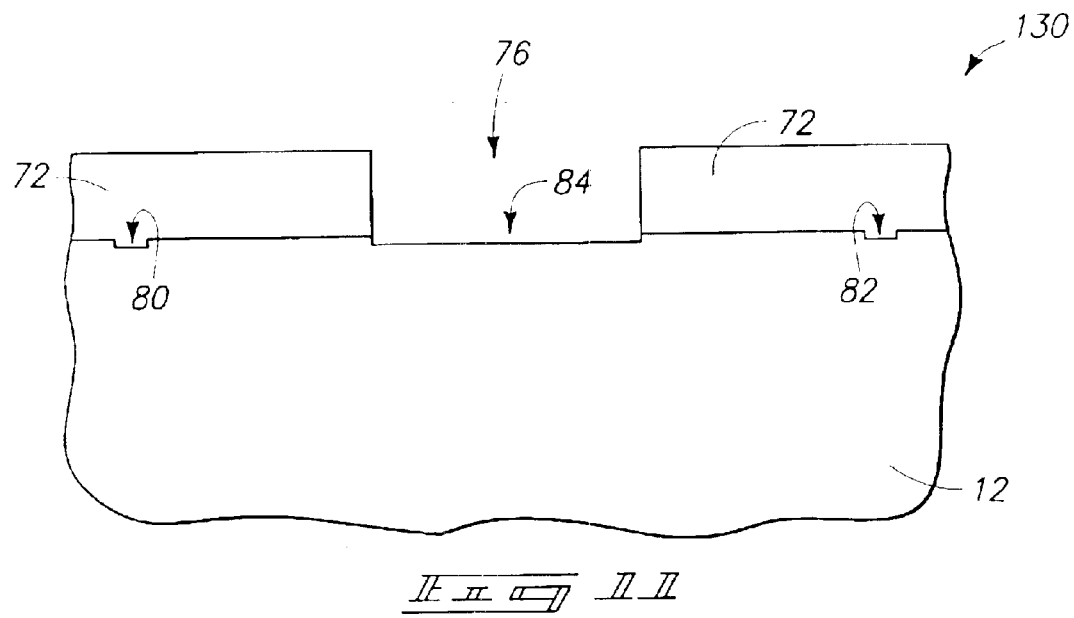
FIG. 11 is a view of the FIG. 5 construction shown at a processing stage subsequent to that of FIG. 6, in accordance with yet another aspect of the invention.

Another aspect of the invention is described with reference to FIGS. 11 and 12. Referring initially to FIG. 11, a construction 130 is illustrated at a processing step subsequent to that of FIG. 6. Specifically, the openings 78 (FIG. 6) have been filled, while leaving opening 76 extending through material 72.

Figure 12:
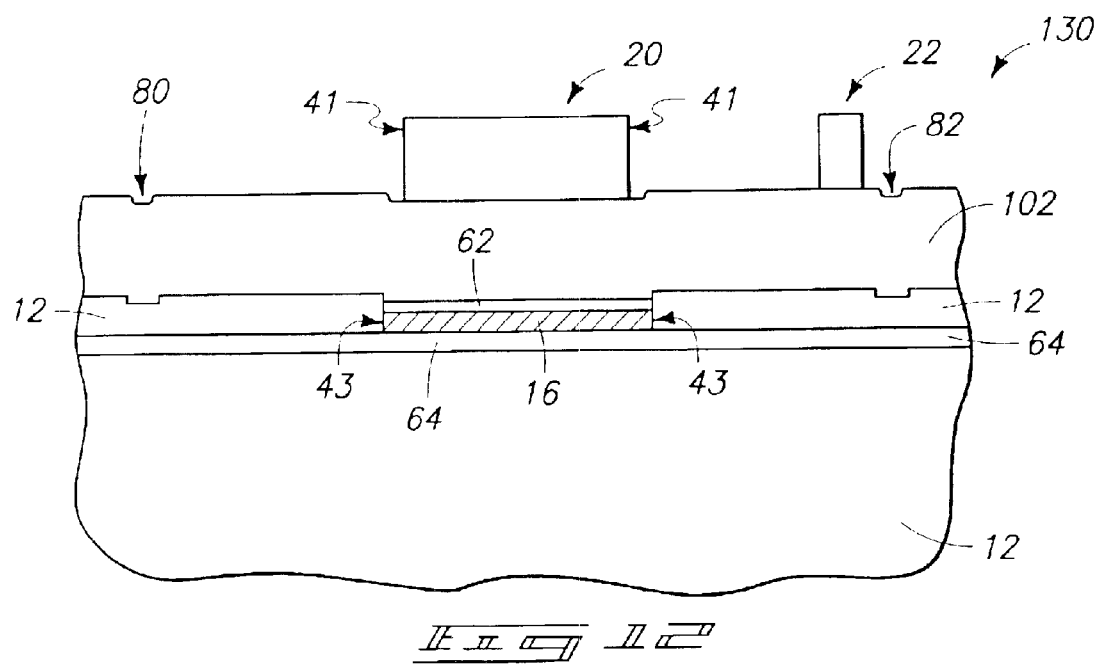
FIG. 12 is a view of the FIG. 5 construction shown at a processing stage subsequent of that to FIG. 11.

Referring to FIG. 12, construction 130 is illustrated after processing similar to that described above with reference to FIGS. 7–9, and such forms the doped regions 62 and 64, as well as the damage region 16. Additionally, the processing forms epitaxial layer 102, charge pump 22, and devices 20. The construction 130 of FIG. 12 is similar to the construction 70 of FIG. 9, but differs in that a damage region has not been formed beneath alignment markings 80 and 82, and doped regions analogous to regions 94 and 96 have also not been formed beneath alignment markings 80 and 82. Instead, the masking material 72 (FIG. 11) blocked alignment markings 80 and 82 during formation of the damage region and the doped region above the damage region. The doped region beneath the damage region (64), however does extend beneath alignment markings 80 and 82 in the shown exemplary aspect of the invention. It is to be understood, however, that the masking material 72 could also be left in place during formation of the lower doped region 64, and accordingly such lower doped region could also be blocked from extending beneath alignment markings 80 and 82.

Figure 13:
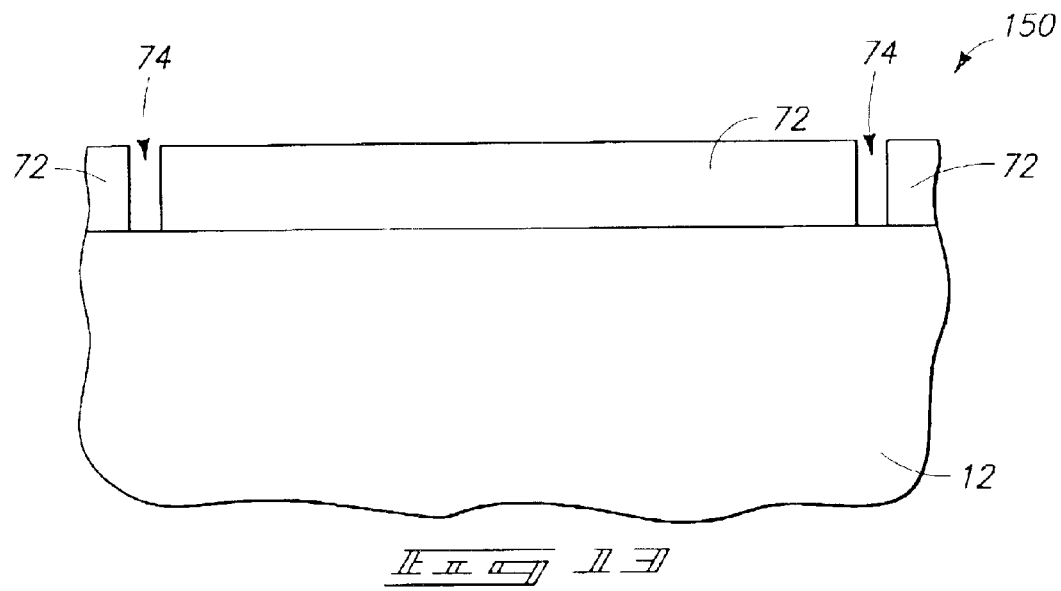
FIG. 13 is a view of a construction at a preliminary stage of an exemplary aspect of the present invention, alternative to the aspect described with reference to FIG. 5.
Figure 14:
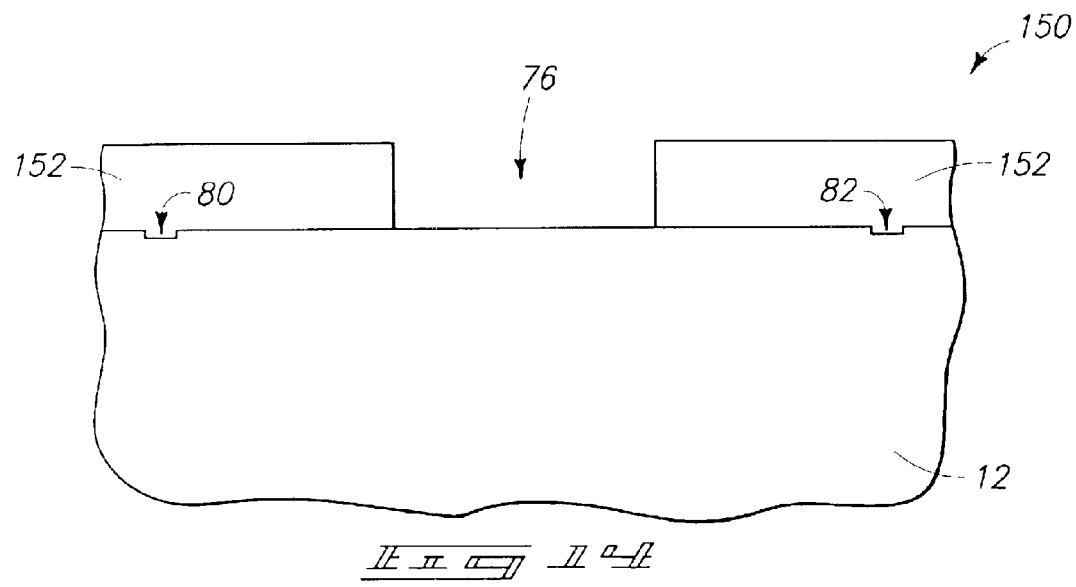
FIG. 14 is a view of the FIG. 13 construction shown at a processing stage subsequent to that of FIG. 13.
Figure 15:
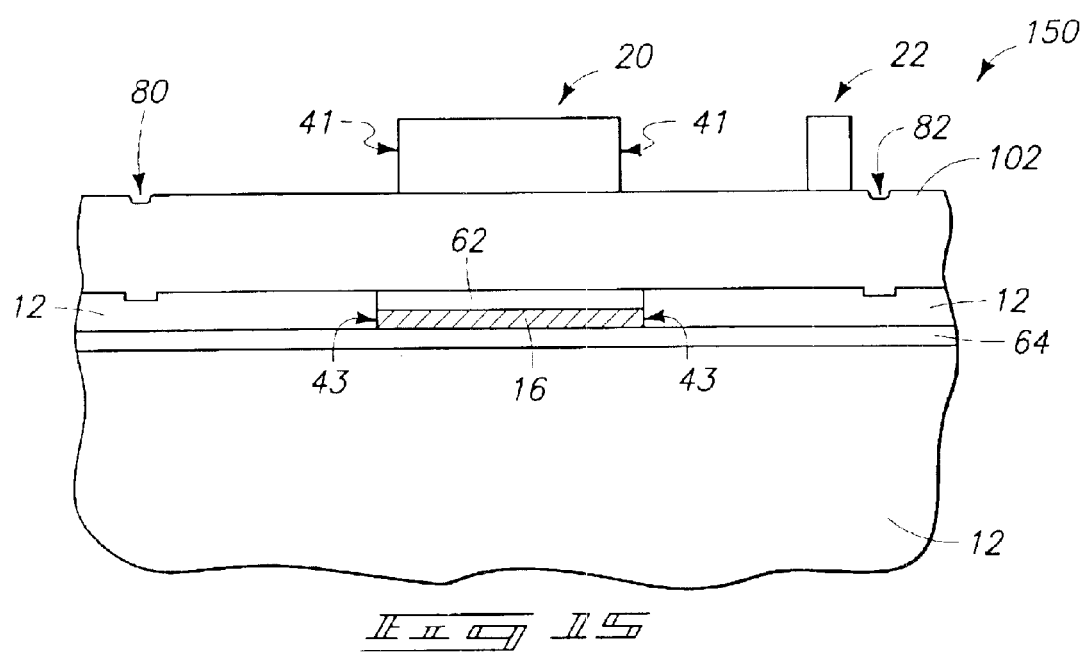
FIG. 15 is a view of the FIG. 13 construction shown at a processing stage subsequent to that of FIG. 14.

FIGS. 13–15 illustrate another aspect of the invention. Referring to FIG. 13, a construction 150 is illustrated at an alternative processing step relative to that shown in FIG. 5. In referring to construction 150, similar numbering will be used as was utilized above in describing FIG. 5, where appropriate. Construction 150 comprises a semiconductor material substrate 12, and a masking layer 72 over the substrate. First openings 74 extend through masking material 72.

Referring to FIG. 14, first openings 74 (FIG. 13) are extended into substrate 12 to form alignment markings 80 and 82, and subsequently masking layer 72 (FIG. 13) is removed from over the substrate. A masking layer 152 is then formed over the substrate. Masking layer 152 is patterned to have an opening 76 (corresponding to the second opening of FIG. 5) extending therethrough.

FIG. 15 illustrates construction 150 after it has been exposed to processing analogous to that described above with reference to FIGS. 7–9. Specifically, damage region 16 is formed, together with upper doped region 62 and lower doped region 64. Also, epitaxial layer 102 is formed, and utilized to support devices 20 and charge pump 22.

Construction 150 is shown at a processing stage in FIG. 15 which is similar to the processing stage of construction 70 in FIG. 9. However, the processing of FIGS. 13–15 has not formed the trench 84 (FIG. 6) extending into substrate 12, and accordingly substrate 12 has an approximately planar surface extending between alignment markings 80 and 82 in the embodiment of FIG. 15. It is noted that lower doped region 64 is shown extending beneath alignment markings 80 and 82, which would occur if masking layer 152 (FIG. 14) is removed prior to the implant which forms doped region 64. In other aspects of the invention, masking layer 152 can be left in place during formation of doped region 64, and accordingly doped region 64 will have a lateral periphery which is approximately aligned with the lateral periphery 43 of damage region 16.

Figure 16:
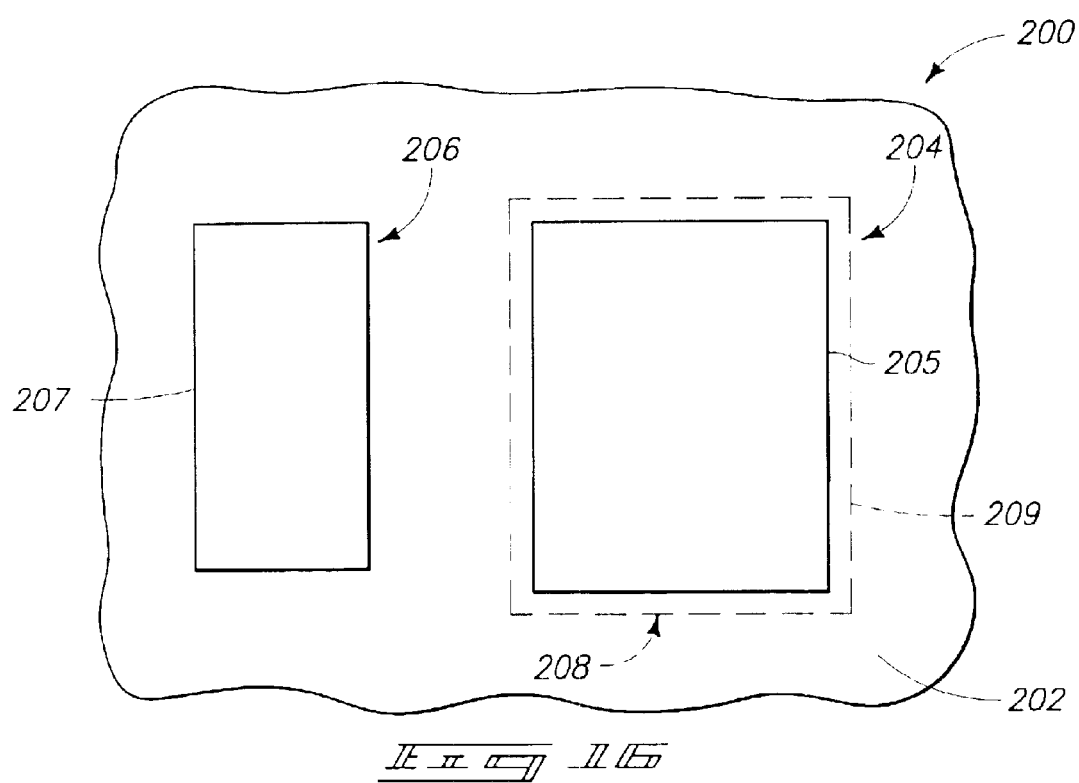
FIG. 16 is a top view of an exemplary construction formed in accordance with an aspect of the present invention.

FIG. 16 illustrates a top view of an exemplary construction 200 formed in accordance with methodology of the present invention. Construction 200 comprises a substrate 202, the upper surface of which can be an epitaxial layer of, for example, monocrystalline silicon. A first set of devices 204 and a second set of devices 206 are supported by upper surface 202. Devices of first set 204 can correspond to, for example, an array of memory devices, and devices of second set 206 can correspond to, for example, one or more charge pumps. The construction 200 is not drawn to scale, and accordingly the relative proportion of the first set of devices 204 to the second set of devices 206 can be significantly different than that shown.

First set of devices 204 comprises a lateral periphery 205, which can be considered a boundary around the first set of devices. Second set of devices 206 comprises a lateral periphery 207 which can be considered a boundary around the second set of devices.

A gettering or damage region is within substrate 202, and illustrated by dashed line 208. The damage region comprises a lateral periphery 209 which can be considered a boundary of the damage region. In aspects of the present invention, damage region 209 is beneath devices 204, but not beneath devices 206. In other words, boundary 209 does not overlap with boundary 207.

In various aspects of the invention, devices of set 204 can be an array of memory cells, such as a DRAM array. Alternatively, devices of set 204 can be FLASH circuitry. In either of such embodiments, the devices of set 206 can be associated with a charge pump. In other embodiments, devices of set 204 can be an array of solar cells, and devices of set 206 can be circuitry associated with the solar cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A semiconductor construction, comprising:
   a substrate comprising semiconductive material;
   an array of devices supported by the substrate, the array being bounded by an outer periphery; and
   a damage region within the semiconductive material of the substrate and under the array of devices; the damage region extending beyond the outer periphery by less than or equal to about one-half of an average electron diffusion length within the semiconductive material of the substrate.

2. The construction of claim 1 wherein the devices are memory devices.

3. The construction of claim 1 wherein the devices are DRAM devices.

4. The construction of claim 1 wherein the devices are FLASH devices.

5. The construction of claim 1 wherein the devices are solar cell devices.

6. The construction of claim 1 wherein the damage region extends less than or equal to about 100 microns beyond the outer periphery.

7. The construction of claim 1 wherein the damage region extends less than or equal to about 50 microns beyond the outer periphery.

8. The construction of claim 1 wherein the damage region extends less than or equal to about 10 microns beyond the outer periphery.

9. The construction of claim 1 wherein the damage region extends less than or equal to about 5 microns beyond the outer periphery.

10. The construction of claim 1 wherein the damage region extends less than or equal to about 1 micron beyond the outer periphery.

11. The construction of claim 1 wherein the damage region does not extend beyond the outer periphery.

12. The construction of claim 1 wherein the devices are memory devices comprising structures supported on a surface of the semiconductive material substrate; and wherein the surface is less than or equal to 4 microns above the damage region.

13. The construction of claim 1 wherein the semiconductive material substrate primarily comprises silicon; and wherein the damage region comprises germanium within a lattice of the silicon.

14. The construction of claim 1 further comprising a doped region of the substrate under the damage region and extending approximately the same distance as the damage region.

15. The construction of claim 1 further comprising a doped region of the substrate over the damage region and extending approximately the same distance as the damage region.

16. A semiconductor construction, comprising:
    a semiconductive material substrate;
    an array of memory devices supported by the substrate;
    a charge pump supported by the substrate and spaced from the memory devices by a distance; the charge pump being configured to pump electrons into the substrate; and
    a damage region within the semiconductive material of the substrate and under the array of memory devices; the damage region extending less than or equal to 50% of the distance between the memory devices and the charge pump.

17. The construction of claim 16 wherein the damage region extends less than or equal to 25% of the distance between the memory devices and the charge pump.

18. The construction of claim 16 wherein the damage region extends less than or equal to 10% of the distance between the memory devices and the charge pump.

19. The construction of claim 16 wherein the damage region extends less than or equal to 5% of the distance between the memory devices and the charge pump.

20. The construction of claim 16 wherein the damage region extends less than or equal to 1% of the distance between the memory devices and the charge pump.

21. The construction of claim 16 further comprising a doped region of the substrate under the damage region and extending under both the damage region and the charge pump.

22. The construction of claim 16 further comprising:
    a first doped region of the substrate over the damage region and extending approximately the same distance as the damage region; and
    a second doped region of the substrate under the damage region and extending under both the damage region and the charge pump.

23. The construction of claim 22 wherein the first and second doped regions are both p-type regions.

24. The construction of claim 22 wherein the first and second doped regions are both n-type regions.

25. The construction of claim 22 wherein one of the first and second doped regions is a p-type region and the other is an n-type region.

* * * * *

UNITED STATES PATENT AND TRADEMARK OFFICE
CERTIFICATE OF CORRECTION

PATENT NO. : 6,828,614 B2
DATED : December 7, 2004
INVENTOR(S) : Fernando Gonzalez It is certified that error appears in the above-identified patent and that said Letters Patent is hereby corrected as shown below:

<u>Column 8,</u>
Line 29, replace "30" with -- 300 --.

Signed and Sealed this

Twenty-third Day of August, 2005

JON W. DUDAS
*Director of the United States Patent and Trademark Office*